(12) United States Patent
Look

(10) Patent No.: US 9,041,409 B1
(45) Date of Patent: May 26, 2015

(54) LOCALIZATION OF FAILURE IN HIGH DENSITY TEST STRUCTURE

(75) Inventor: Kevin T. Look, Fremont, CA (US)

(73) Assignee: XILINX, INC., San Jose, CA (US)

( * ) Notice: Subject to any disclaimer, the term of this patent is extended or adjusted under 35 U.S.C. 154(b) by 723 days.

(21) Appl. No.: 13/348,549

(22) Filed: Jan. 11, 2012

(51) Int. Cl.
 *G01R 31/08* (2006.01)
 *G01R 31/26* (2014.01)
 *G01R 31/28* (2006.01)

(52) U.S. Cl.
 CPC ............. *G01R 31/08* (2013.01); *G01R 31/2812* (2013.01)

(58) Field of Classification Search
 CPC ............... G01R 31/28; G01R 31/2812; G01R 31/2851; G01R 31/2896
 USPC .............................. 324/523, 522, 528, 757.04
 See application file for complete search history.

(56) References Cited

U.S. PATENT DOCUMENTS

| 5,060,027 | A * | 10/1991 | Hart et al. ....................... 257/88 |
| 6,452,502 | B1 * | 9/2002 | Dishongh et al. ............. 340/653 |
| 8,030,943 | B2 * | 10/2011 | Spuhler et al. ................ 324/522 |

OTHER PUBLICATIONS

Hess, C., et al., "High Density Test Structure Array for Accurate Detection and Localization of Soft Fails," Proc. IEEE 2008 Int'l. Conf. on Microelectronic Test Structures, vol. 21, Mar. 2008, 6 pgs.
Li, Y.G., et al., "Test Structure Failed Node Localization and Analysis From Die Backside," 15th Int'l. Sym. on the Physical and Failure Analysis of Integrated Circuits, Aug. 2008 (IPFA 2008) 3 pgs.

* cited by examiner

*Primary Examiner* — Amy He
(74) *Attorney, Agent, or Firm* — Kevin T. Cuenot

(57) ABSTRACT

An integrated circuit structure can include a plurality of solder bumps coupled in series forming a chain and a plurality of diodes, wherein each diode is coupled to one of the plurality of solder bumps. The integrated circuit structure also can include a first pad coupled to the solder bump of the plurality of solder bumps at an end of the chain. The first pad can be configured to provide a test current responsive to application of a forward bias voltage to each diode of the plurality of diodes.

20 Claims, 4 Drawing Sheets

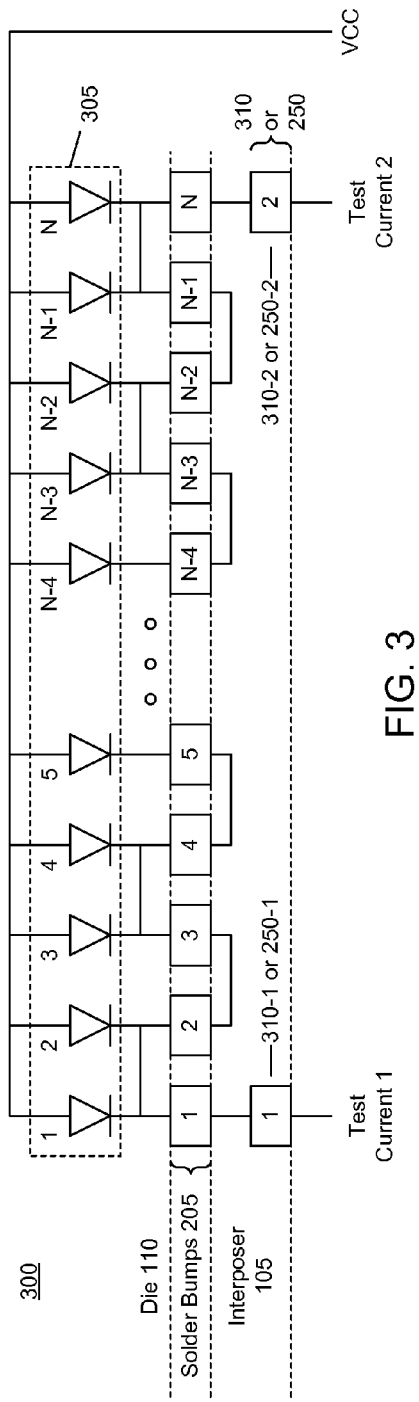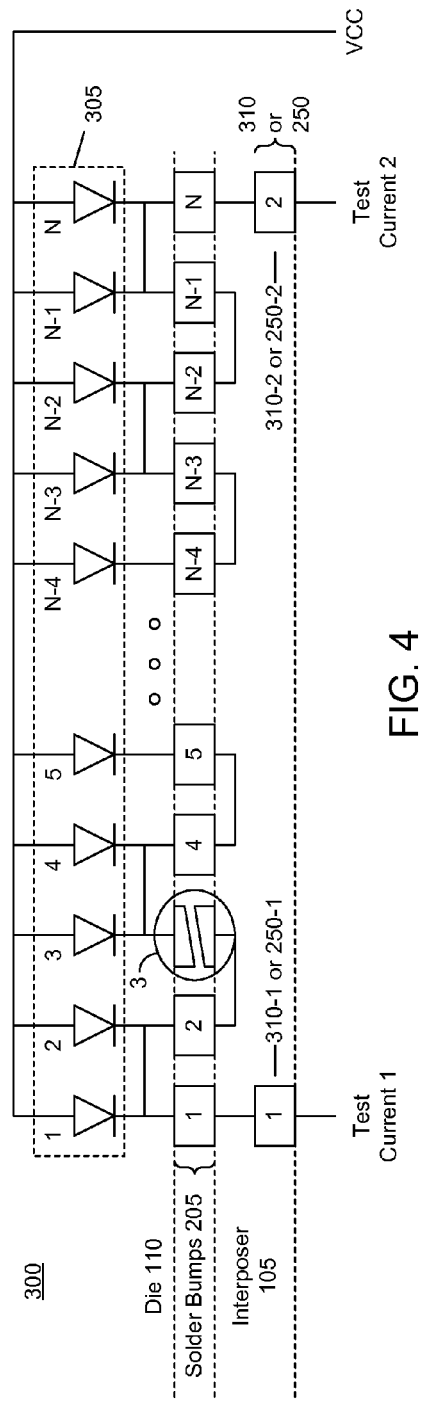

LOCALIZATION OF FAILURE IN HIGH DENSITY TEST STRUCTURE

FIELD OF THE INVENTION

One or more embodiments disclosed within this specification relate to integrated circuits (ICs). More particularly, one or more embodiments relate to testing ICs.

BACKGROUND

Multi-die integrated circuits (ICs) are a class of ICs in which multiple dies are placed within a single package. A multi-die IC also can be referred to as a "system in a package" or "SiP." A multi-die IC can include circuit structures that allow the dies to communicate with one another within the single package at faster speeds than would be attainable were the dies to be implemented as separate ICs or as individual IC packages mounted on a printed circuit board.

In order to function with this increased level of speed and/or efficiency, signals must be able to propagate from one die to another within a multi-die IC. The circuit structures that effectuate the inter-die exchange of signals must be fabricated with at least a minimum level of reliability. Otherwise, yields can decrease significantly, thereby increasing the cost of producing multi-die ICs.

SUMMARY

One or more embodiments disclosed within this specification relate to integrated circuits and, more particularly, to testing integrated circuits.

An embodiment can include an integrated circuit structure. The integrated circuit structure can include a plurality of solder bumps coupled in series forming a chain and a plurality of diodes. Each diode can be coupled to one of the plurality of solder bumps. A first pad can be coupled to a first solder bump of the plurality of solder bumps at a first end of the chain. A second pad can be coupled to a second solder bump of the plurality of solder bumps at a second end of the chain.

Another embodiment can include an integrated circuit structure. The integrated circuit structure can include a first die and a second die on a planar surface of the first die. The second die can include a plurality of diodes. A plurality of solder bumps between the first die and the second die can electrically couple the first die to the second die. The plurality of solder bumps can be coupled in series forming a chain. Each diode can be coupled to one of the plurality of solder bumps. The first die can include a first pad coupled to a first solder bump of the plurality of solder bumps at a first end of the chain and a second pad coupled to a last solder bump of the plurality of solder bumps at a second end of the chain.

Another embodiment can include a method of testing an integrated circuit structure. The method can include applying a forward bias voltage to each of a plurality of diodes, wherein each diode of the plurality of diodes is coupled to one solder bump of a plurality of solder bumps and wherein the plurality of solder bumps are arranged in a serially connected chain. The method can include measuring a test current from a first pad coupled to a first solder bump of the plurality of solder bumps in the chain while a second pad coupled to a last solder bump of the plurality of solder bumps in the chain is set to a high impedance state. The method further can include determining whether a discontinuity is detected in the chain according to a comparison of the test current with a current threshold.

BRIEF DESCRIPTION OF THE DRAWINGS

FIG. 3 is a circuit diagram illustrating a test structure for an IC structure in accordance with another embodiment disclosed within this specification.

FIG. 4 is a circuit diagram illustrating the test structure of FIG. 3 in accordance with another embodiment disclosed within this specification.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to testing ICs. An IC structure formed using multiple dies can be subjected to a variety of tests to ensure that signals are able to reliably propagate among the dies, e.g., from one die to another. Some IC structures utilize solder bumps as the mechanism to electrically couple two or more dies together and facilitate the passage of electrical signals. In testing an IC structure that utilizes solder bumps, the solder bumps can be formed into one or more chains.

Using a test configuration in which forward biased diodes are coupled with solder bumps, one or more solder bump chains can be tested. The test configurations described facilitate the detection of failures such as discontinuities within a chain and also the determination of a location of any detected failure within the chain being tested. The test configurations and techniques disclosed within this specification utilize less silicon area than other conventional testing techniques and utilize fewer pins of the IC structure.

Figure 1:
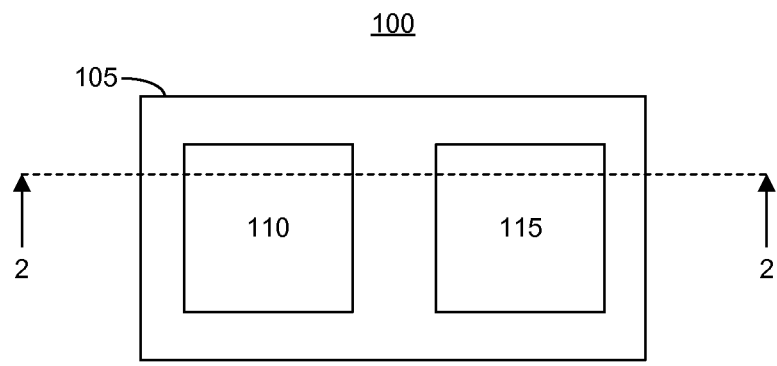
FIG. 1 is a block diagram illustrating a topographic view of an integrated circuit (IC) structure in accordance with an embodiment disclosed within this specification.

FIG. 1 is a block diagram illustrating a topographic view of an IC structure 100 in accordance with an embodiment disclosed within this specification. IC structure 100 is an example of a multi-die IC structure. IC structure 100 also illustrates an example of a packing approach that can be used to stack multiple dies within a single package. IC structure 100 can include a silicon interposer (interposer) 105, a die 110, and a die 115.

Interposer 105 can be a die having a planar surface on which one or more dies, e.g., dies 110 and 115, can be horizontally stacked. As shown, dies 110 and 115 can be located side-by-side on the planar surface of interposer 105. Although implemented with two horizontally stacked dies in FIG. 1, IC structure 100 also can be implemented with more than two dies being horizontally stacked. In another example, die 115 can be stacked vertically on top of die 110. In still another example, interposer 105 can be used as an intermediate layer between two vertically stacked dies. In that case, interposer 105 can isolate vertically stacked dies from one another within a multi-die IC package.

Interposer 105 can provide a common mounting surface and electrical coupling point for two or more dies of a multi-die IC structure. Interposer 105 can serve as an intermediate layer for interconnect routing between dies or as a ground or power plane for IC structure 100. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In general, interposer 105 can be implemented as a passive die in that interposer 105 can include no active circuit elements, e.g., no P-material in contact with N-material or "PN" junctions. In another aspect, however, interposer 105 can be manufactured using one or more additional process steps that allow the creation of active circuit elements such as, for example, transistor devices and/or diode devices. As noted, interposer 105 is, in general, a die and can be characterized by the presence of one or more TSVs as will be described in greater detail within this specification.

Figure 2:
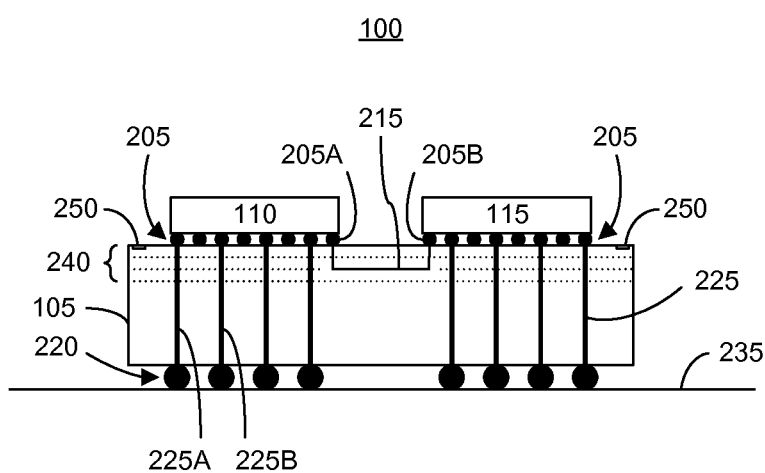
FIG. 2 is a block diagram illustrating a cross-sectional side view of an IC structure in accordance with another embodiment disclosed within this specification.

FIG. 2 is a block diagram illustrating a cross-sectional side view of an IC structure in accordance with another embodiment disclosed within this specification. More particularly, FIG. 2 illustrates a view of IC structure 100 of FIG. 1 taken along cut-line 2-2. As such, like numbers will be used to refer to the same items throughout this specification.

Referring to FIG. 2, each of dies 110 and 115 can be electrically coupled to interposer 105 via solder bumps 205. In addition, each of solder bumps 205 can serve to physically attach dies 110 and 115 to interposer 105. Through solder bumps 205, for example, interposer 105 is coupled to die 110. Similarly, through solder bumps 205, die 115 is coupled to interposer 105. In an embodiment, solder bumps 205 can be implemented in the form of "micro-bumps."

Interconnect material within interposer 105 can be used to form inter-die wires that can pass inter-die signals between dies 110 and 115. A region labeled 240 of interposer 105 can include one or more conductive, e.g., patterned metal, layers forming wires or interconnects. For example, interconnect 215 can be formed using one or more of the patterned metal layers of region 240. Accordingly, interconnect 215 can represent an inter-die wire that can couple each of solder bumps 205A and 205B, thereby coupling die 110 to die 115 and allowing the exchange of inter-die signals between dies 110 and 115.

It should be appreciated that interposer 105 can be implemented with multiple conductive layers that can be coupled together with vias (not shown). In that case, interconnect 215 can be implemented within two or more conductive layers coupled together using vias within interposer 105. The use of multiple conductive layers to implement interconnects, e.g., inter-die wires, within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

In one aspect, a test structure can be implemented within IC structure 100. In one aspect, the test structure can include one or more input/output (I/O) pads (pads) 250 located on a same surface of interposer 105 on which dies 110 and 115 are mounted. Each of pads 250 can be coupled to one of solder bumps 205 using one or more patterned metal layers and vias from region 240, e.g., interconnect 215. Pads 250 can be used for testing purposes as described in further detail within this specification. For example, one or more of pads 250 can be used to provide signal(s), e.g., power or other test signals, to IC structure 100. One or more of pads 250 also can be used as test nodes from which one or more electrical quantities such as voltage or current can be measured.

Solder bumps 220 can be used to electrically couple interposer 105 to a surface 235. Surface 235 can represent, for example, a substrate of a multi-die IC package in which IC structure 100 is implemented. Solder bumps 220 further can couple IC structure 100 to a node external to the multi-die IC package. In an embodiment, solder bumps 220 can be implemented in the form of "C4-bumps." For example, solder bumps 220 can be used to physically attach interposer 105 to surface 235. TSVs 225 represent vias that, when filled with conductive material, form an electrical connection that vertically transverses, e.g., extends through a substantial portion, if not the entirety of, interposer 105.

TSVs 225 can be implemented by drilling or etching an opening into interposer 105 that extends from a first planar surface, i.e., the surface to which solder bumps 205 are coupled, through to a second planar surface, i.e., the surface to which solder bumps 220 are coupled. Conductive material then can be deposited within the openings. Examples of conductive material that can be used to fill the openings to form TSVs 225 can include, but are not limited to, aluminum, gold, copper, nickel, various silicides, and/or the like. In another example, TSVs 225 can traverse substantially through interposer 105 to couple solder bumps 220 with one or more metal layers of region 240 as are used to form interconnect 215. Interconnect 215 and one or more conventional vias then can couple TSVs 225 to solder bumps 205.

TSVs 225, in combination with solder bumps 220, couple die 110 to surface 235. As shown within FIG. 2, the first planar surface of interposer 105 can be physically coupled to dies 110 and 115. The second planar surface of interposer 105 can be physically coupled to surface 235 when IC structure 100 is implemented within a package.

For testing purposes, IC structure 100 can be tested in wafer form, e.g., prior to attachment of solder bumps 220. For example, one or more pads can be located on the bottom side of interposer 105, e.g., the same side to which solder bumps 220 are later attached. One or more of the pads can be used to provide signal(s), e.g., power or other test signals, to IC structure 100. One or more pads also can be used as test nodes from which one or more electrical quantities can be measured.

Die 110 and die 115 can be implemented as any of a variety of different types of dies. For example, one or both of dies 110 and 115 can be implemented as a memory device, a processor, e.g., a central processing unit, an application-specific IC, or a programmable IC. Thus, each of dies 110 and 115 can be implemented as a similar or same type of IC. In the alternative, die 110 can be implemented as first type of IC while die 115 is implemented as a second and different type of IC.

In general, a programmable IC refers to a type of IC that can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to I/O resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

FIG. 3 is a circuit diagram illustrating a test structure 300 for an IC structure in accordance with another embodiment disclosed within this specification. Test structure 300 can be used to test for a discontinuity in a signal path and, as such, can be implemented within a multi-die IC structure such as IC structure 100 to test a signal path implemented therein.

Test structure 300 can be use to test for discontinuities, e.g., failures, in a signal path formed of solder bumps. A "discontinuity" can refer to a location or portion of a signal path in which the resistance of the signal path exceeds a threshold resistance determined to be a maximum level of resistance that is tolerable in a signal path for test structure 300 and/or the for the particular IC structure in which test structure 300 is implemented. A discontinuity, for example, can have a level of resistance determined to be sufficiently high, e.g., exceeding the threshold, to be considered an open circuit or to adversely influence performance of the IC structure.

In one aspect, test structure 300 can be implemented within an IC structure that is fabricated for purposes of testing. For example, test structure 300 can be implemented within an IC structure that is not intended for release to users or customers. As such, test structure 300 can be implemented as hard circuitry that is available for purposes of testing only. Using test structure 300, yield for a given IC structure including test structure 300 can be determined in relation to solder bumps 205. Once a desired yield is achieved or determined to be acceptable, test structure 300 can be removed from future production versions of the IC structure.

As noted, test structure 300 can be implemented within an IC structure as described with reference to FIGS. 1-2 of this specification. Accordingly, test structure 300 is illustrated as being implemented within interposer 105 and die 110. It should be appreciated that die 110 is used for purposes of illustration only. As such, die 115 can be used in addition to die 110 to implement further test configurations or in lieu of die 110.

Die 110 can include diodes 305. For purposes of illustration, diodes 305 can be referenced generally as a group or collection of diodes using reference number 305. Particular ones of the diodes can be referenced using the nomenclature "305-1" in reference to the leftmost diode and "305-N" in reference to the rightmost diode. "N" can be an integer number that is greater than one. In one aspect, N can be equal to the number of solder bumps 205 of the particular chain of solder bumps 205 being tested, i.e., the number of solder bumps in test structure 300. Test structure 300 can be implemented with a one-to-one relationship between solder bumps 205 in the chain and diodes 305 used. Accordingly, N will also specify the number of diodes 305 in the chain, e.g., in test structure 300.

Each of diodes 305 can be the same, or substantially the same, e.g., within acceptable tolerances of one another. In one aspect, each of diodes 305 can be created or modeled after a reference diode. In this regard, each of diodes 305, when turned on or forward biased, will generate a predetermined and expected amount of forward bias current as determined from the reference diode upon which each of diodes 305 is based.

In one aspect, interposer 105 can include a plurality of I/O pads (pads) 310 implemented on a planar surface that is opposite the planar surface on which die 110 is implemented. Pads 310-1 and 310-2 can be coupled to solder bumps 205 through TSVs or a combination of TSVs and metal interconnect as previously described. In another aspect, pads 250-1 and 250-2 can be used. As described with reference to FIG. 2, pads 250-1 and 250-2 can be located on the same surface of interposer 105 as die 110. For example, pads 250-1 and 250-2 can be located outside of the area of the surface of interposer 105 that is occupied by die 110 and/or die 115. In that case, pads 250-1 and 250-2 can be coupled to solder bumps 205-1 and 205-N respectively using the metal interconnect of interposer 105 and one or more vias as may be required. It should be appreciated that in the event that the IC structure within which test structure 300 is implemented is packaged, pads 310 can be coupled to I/O pins.

Each diode 305 can be coupled to a voltage source denoted as VCC. VCC can be a voltage source that is sufficient to forward bias each of diodes 305, e.g., a forward bias voltage. VCC, for example, can provide each of diodes 305 with a sufficiently large current to forward bias each one of diodes 305. In general, the current that flows through one of diodes 305 when forward biased can be referred to as $I_{fb}$.

In one aspect, the IC structure in which test structure 300 is implemented can be in wafer form. In that case, VCC can be provided from a test system that supplies test and/or operational voltages to the IC structure. For example, VCC can be provided from a probe of a probe card that is in contact with a pad of die 110 (not shown). In another aspect, VCC can be provided by a probe of a probe card that contacts a pad of interposer 105. For example, a probe of a probe card can contact another one of pads 310 or another one of pads 250 of interposer 105. Power supplied to one of pads 310 can be provided to die 110 via a TSV. Power supplied to one of pads 250 can be provided to die 110 through interconnect and vias.

In another example, the IC structure including test structure 300 can be included within a package. In that case, VCC can be provided through a package pin of the IC structure. The package pin can coupled to one of pads 310 as described allowing the voltage to propagate to die 110. Regardless of the particular implementation, an anode of each diode 305 can be coupled to VCC. A cathode of each diode 305 can be coupled to one of solder bumps 205.

As shown, solder bumps 205 are coupled in series forming a chain in which solder bump 205-1 can be referred to as the first solder bump of the chain and solder bump 205-N can be referred to as the last solder bump in the chain. Though coupled in series, some of the connections between solder bumps 205 can be implemented within interposer 105 and other connections between solder bumps 205 can be implemented within die 110. For example, a first pair of solder bumps 205 formed of solder bumps 205-1 and 205-2 can be directly coupled by a connection within die 110. For example, solder bumps 205-1 and 205-2 can be connected by a metal connection or wire implemented within die 110.

For purposes of description, the connection described with reference to the first pair of solder bumps formed of solder bumps 205-1 and 205-2 can be referred to as a first type of connection or an "active die" connection. For example, the active die connections can be implemented as a short circuit between the cathodes of two consecutive diodes 305, e.g., diodes 305-1 and 305-2.

A second pair of solder bumps formed of solder bumps 205-2 and 205-3 can be coupled by a connection that is within interposer 105. The second pair of solder bumps is connected in serial, as is the first pair of solder bumps. The connection implemented for the second pair of solder bumps represents a second type of connection referred to as an "interposer" connection. For example, an interposer connection, or second type of connection, can be implemented as a short circuit that is formed between solder bumps 205-2 and 205-3 using interconnect within interposer 105.

In test structure 300, solder bumps 205 are serially coupled using alternating connection types. The connection types, for example, can alternate between active die connections and interposer connections. As shown, solder bumps 205-1 and 205-2 are coupled together using an active die connection. Solder bumps 205-2 and 205-3 are coupled together using an interposer connection. Solder bumps 205-3 and 205-4 are coupled together by an active die connection. The alternating connection types within test structure 300 can continue as illustrated. In this regard, solder bumps 205 can be said to be coupled using connections that alternate between a first type and a second type for consecutive ones of solder bumps 205 in the chain.

Pad 310-1 can function as a first test node from which a first test current (test current 1) can be read. Pad 310-1 is the pad that is coupled to the first solder bump, i.e., solder bump 205-1, in the chain of solder bumps 205 being tested. Pad 310-2 can function as a second test node from which a second test current (test current 2) can be read. Pad 310-2 is the pad that is coupled to the last solder bump, i.e., solder bump 205-N, in the chain of solder bumps 205 being tested.

In one aspect, test current 1 can be measured. Test current 2 also can be measured. For example, when test current 1 is measured at test node 1, e.g., pad 310-1, the second test node, e.g., pad 310-2, can be set to a high impedance state. For example, the second test node can be coupled to a high impedance node or left uncoupled from any other node, e.g., an open circuit, to prevent or inhibit current flow through the second test node. When test current 2 is measured at test node 2, the first test node can be set to a high impedance state as described to inhibit or prevent current flow through the first test node.

When the chain of solder bumps 205 has no discontinuity and VCC is applied to each of diodes 305, test current 1 will be equal, or substantially equal, to test current 2. Each of test current 1 and test current 2 will be equal, or substantially equal, to N times the forward bias current of the model diode, e.g., N times $I_{fb}$. For purposes of description, the quantity of current "N times $I_{fb}$" can be referred to as a threshold current. When a discontinuity exists in the chain of solder bumps 205, each of test currents 1 and 2 will be less than the threshold current of N times $I_{fb}$. In that case, the value of one or both of test currents 1 and 2 can indicate the location of the discontinuity in the chain of solder bumps 205.

FIG. 4 is a circuit diagram illustrating test structure 300 of FIG. 3 in accordance with another embodiment disclosed within this specification. FIG. 4 illustrates a case in which a discontinuity exists in the chain of solder bumps 205 that is formed. As illustrated, solder bump 205-3 includes a discontinuity, e.g., an imperfection, fracture, or other physical anomaly that manifests itself as a discontinuity in an electrical system such as the IC structure.

Responsive to application of VCC to each of diodes 305, a test system can be used to determine or measure test current 1 and/or test current 2. Due to the discontinuity in solder bump 205-3, test current 1 and test current 2 will be less than N times $I_{fb}$. More particularly, test current 1 will be equal to, or substantially equal to, two (2) times the forward bias current of the model diode, e.g., 2$I_{fb}$, since the current from diodes 305-1 and 305-2 will pass to pad 310-1. Test current 2 will be equal, or substantially equal to, $(N-2)I_{fb}$, since the current from each of diodes 305-3 through 305-N will pass to pad 310-2. In general, the discontinuity effectively transforms test structure 300 into a current divider, with the division point corresponding to the discontinuity.

When measuring test current 1, the location of the discontinuity can be determined according to the expression [(test current $1/I_{fb}$)+1], where the result indicates the solder bump number, e.g., 3 denoting solder bump 310-3, in which the discontinuity is detected. When measuring test current 2, the location of the discontinuity can be determined according to the expression [N−(output test current $2/I_{fb}$)+1]. For purposes of illustration, consider the case in which N=10. In that case, the expression [(output test current $1/I_{fb}$)+1] yields a result of 3. The expression [N−(output test current $2/I_{fb}$)+1] yields a result of 3.

Test structure 300, in general, utilizes three I/O nodes or pads. For example, test structure 300 uses a first node to receive VCC, a second node to measure output current 1, and a third node to measure output current 2. A discontinuity can be detected using test structure 300. Further, a location of a detected discontinuity can be detected within a given chain using the three nodes and without utilizing more complicated addressing schemes.

Figure 5:
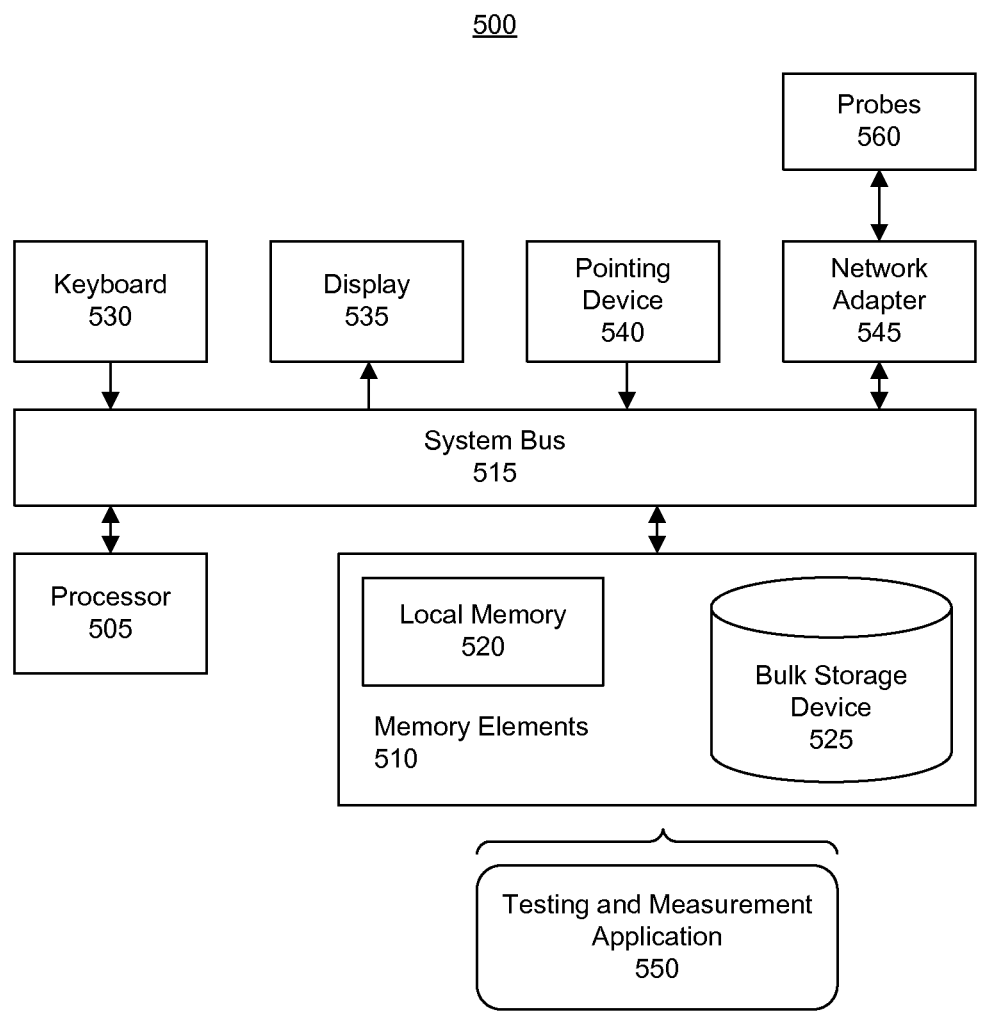
FIG. 5 is a block diagram illustrating a system for IC testing in accordance with another embodiment disclosed within this specification.

FIG. 5 is a block diagram illustrating a system 500 for IC testing in accordance with another embodiment disclosed within this specification. System 500 can include at least one processor 505 coupled to memory elements 510 through a system bus 515. As such, system 500 can store program code within memory elements 510. Processor 505 can execute the program code accessed from memory elements 510 via system bus 515. In one aspect, for example, system 500 can be implemented as a computer that is suitable for storing and/or executing program code. It should be appreciated, however, that system 500 can be implemented in the form of any system comprising a processor and memory that is capable of performing the functions described within this specification.

Memory elements 510 can include one or more physical memory devices such as, for example, local memory 520 and one or more bulk storage devices 525. Local memory 520 refers to random access memory or other non-persistent memory device(s) generally used during actual execution of the program code. Bulk storage device(s) 525 can be implemented as a hard drive or other persistent data storage device. System 500 also can include one or more cache memories (not shown) that provide temporary storage of at least some program code in order to reduce the number of times program code must be retrieved from bulk storage device 525 during execution.

Input/output (I/O) devices such as a keyboard 530, a display 535, and a pointing device 540 optionally can be coupled to system 500. The I/O devices can be coupled to system 500 either directly or through intervening I/O controllers. One or more network adapters 545 also can be coupled to system 500 to enable system 500 to become coupled to other systems, computer systems, remote printers, and/or remote storage devices through intervening private or public networks. Modems, cable modems, and Ethernet cards are examples of different types of network adapters 545 that can be used with system 500.

For example, as shown, system 500 can be coupled to one or more probes or probe cards illustrated as probes 560. It should be appreciated that while probes 560 are illustrated as being coupled to system 500 through network adapter 545, probes 560 can be communicatively linked to system 500 through any of a variety of other interfaces using any of a variety of I/O standards.

As pictured in FIG. 5, memory elements 510 can store a testing and measurement (TM) application 550. TM application 550, being implemented in the form of executable program code, can be executed by system 500. System 500 can control the operation of probes 560 to implement testing of an IC structure, whether in wafer form or in packaged form. In general, system 500 can provide test signals to control probes 560. Further, system 500 can obtain, store, or read measurements of electrical quantities from an IC structure, e.g., a test structure as described.

System 500 can output results of any testing. As used herein, "outputting" and/or "output" can mean storing in memory elements 510, for example, writing to a file stored in memory elements 510, writing to display 535 or other peripheral output device, e.g., providing visual notifications, playing audible notifications, sending or transmitting to another system, exporting, or the like.

FIG. 5 is provided for purposes of illustration only. The techniques described within this specification can be performed by any of a variety of IC testing systems equipped with probes and able to perform the measurements and calculations described. In another arrangement, the techniques described within this specification can be performed by an IC test system, e.g., where probes 560 can be an IC test system equipped with probes, in communication with another master system, e.g., a computer system as described, that controls the processes implemented or performed by the IC test system.

Figure 6:
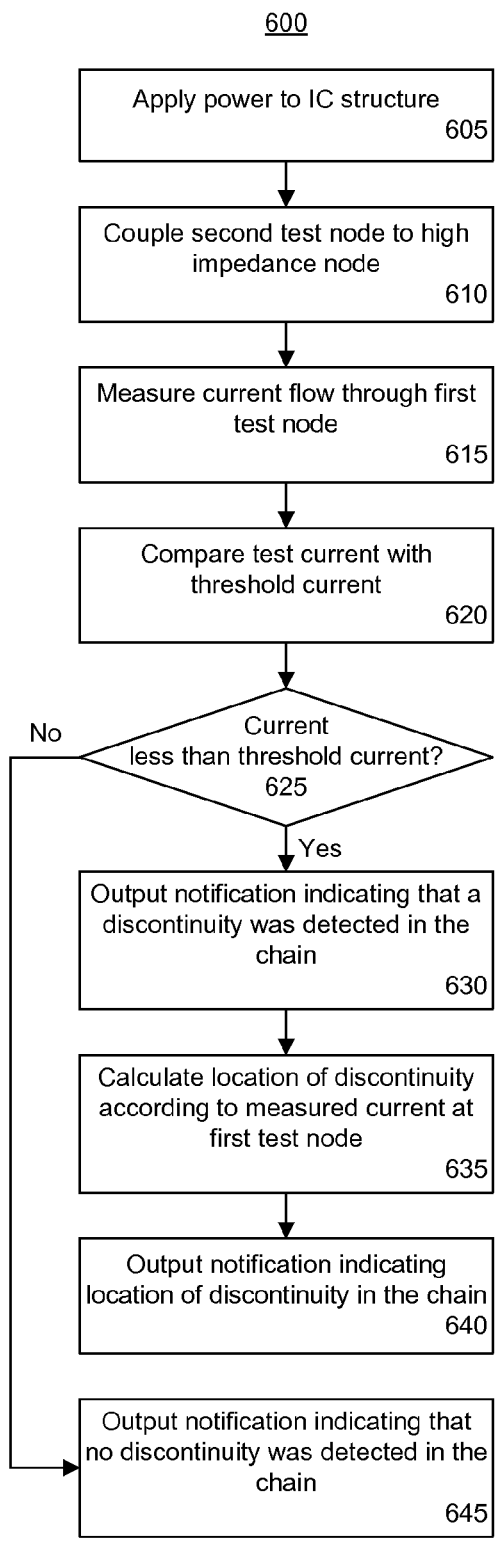
FIG. 6 is a flow chart illustrating a method of testing an IC structure in accordance with another embodiment disclosed within this specification.

FIG. 6 is a flow chart illustrating a method 600 of testing an IC structure in accordance with another embodiment disclosed within this specification. Method 600 can be performed using a system as described with reference to FIG. 5, e.g., a processor based system or other circuitry capable of controlling the operation of one or more probes and analyzing received measurements of electrical quantities from an IC structure under test. Method 600 can begin in a state where an IC structure is loaded into the system, i.e., an IC test system referred to as the "system." The IC structure can be in wafer form or can be packaged and can include a test structure as described with reference to FIGS. 1-4.

As discussed, method 600 can be performed using a limited number of pins (or pads) of the IC structure under test. For example, in testing a chain of solder bumps of a test structure as described within this specification, three nodes can be used. A first pad (pin) can be used to provide power to the IC structure under test. A second pad (pin) can be used to measure the first test current. A third pad (pin) optionally can be used to measure the second test current.

In block 605, the system can apply power, or cause power to be applied, to the IC structure to provide the needed forward bias current to each of the diodes in the chain being tested. In block 610, the system can set the second test node to a high impedance state. For example, the system can couple the second test node, or cause the second test node to be coupled, to a high impedance node, e.g., a probe or left as an open circuit, to inhibit current flow through the second test node. In block 615, the system can measure the current at the first test node, e.g., the test current. In measuring the current flowing through the first test node, the first test node can be coupled to a low impedance node, e.g., a low impedance probe or ground.

In block 620, the system can compare the test current to the threshold current. In block 625, the system can determine whether the test current is less than the threshold current. As discussed, when the test current is less than the threshold current, the system can determine that a discontinuity exists in the chain. When the test current is not less than the threshold current, e.g., is equal or substantially equal to the threshold current, the system can determine that a discontinuity was not detected in the chain. Accordingly, responsive to determining that the test current is less than the threshold current, method 600 can continue to step 630. Responsive to determining that the test current is not less than the threshold current, e.g., is equal to or substantially equal to the threshold current, method 600 can proceed to step 645. In step 645, the system can output a notification indicating that no discontinuity was detected in the chain.

Continuing with step 630, the system can output a notification indicating that a discontinuity was detected in the chain. In step 635, the system can calculate the location of the discontinuity according to the current measured at the first test node. For example, the system can solve the expression [(test current $1/I_{fb}$)+1] to determine the particular solder bump expected to have the discontinuity. It should be appreciated that a test current from the second test node can be measured in lieu of the test current from the first test node. In that case, the expression [N-(output test current $2/I_{fb}$)+1] can be used to determine the particular solder bump expected to have the discontinuity.

In step 640, the system can output a notification indicating the location of the discontinuity. For example, the system can indicate the particular solder bump at which the discontinuity is expected to be located.

In another embodiment, method 600 can be performed a first time where the test current from the first test node is measured and analyzed and a second time where the test current from the second test node is measured and analyzed. Measuring and analyzing the test current at each of the first and the second test nodes can be useful in cases where more than one discontinuity exists. For example, when a discontinuity is detected from measuring and analyzing current at the first test node, an additional discontinuity can exist to the right of the discovered discontinuity. In that case, measuring and analyzing the test current at the second node can detect the second discontinuity and the location of the second discontinuity.

The one or more embodiments disclosed within this specification facilitate the testing of multi-die ICs. The test structure described can be implemented with a large number of solder bumps. Further the test structure requires less silicon area than other conventional techniques such as those that utilize addressing to test particular connections.

The flowchart in the figures illustrates the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which includes all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit structure comprising:
 a plurality of solder bumps coupled in series forming a chain;
 a plurality of diodes, wherein each diode is coupled to one of the plurality of solder bumps;
 a first pad coupled to a first solder bump of the plurality of solder bumps at a first end of the chain; and
 a second pad coupled to a second solder bump of the plurality of solder bumps at a second end of the chain.

2. The integrated circuit structure of claim 1, wherein:
 the first pad is configured to provide a test current responsive to application of a forward bias voltage to each diode of the plurality of diodes and the second pad is set to a high impedance state; and
 wherein a quantity of the test current indicates whether a discontinuity is detected in the chain.

3. The integrated circuit structure of claim 2, wherein a discontinuity is detected in the chain responsive to determining that the test current is less than an integer multiple of a forward bias current of one diode of the plurality of diodes.

4. The integrated circuit structure of claim 3, wherein the integer multiple is equal to a number of the plurality of diodes.

5. The integrated circuit structure of claim 3, wherein the quantity of the test current indicates a location of the discontinuity in the chain.

6. The integrated circuit structure of claim 2, wherein a location of a discontinuity in the chain is detected responsive to determining that the test current is less than an integer multiple of a forward bias current of one of the plurality of diodes.

7. The integrated circuit structure of claim 6, wherein the integer multiple is equal to a number of the plurality of diodes.

8. The integrated circuit structure of claim 2, wherein no discontinuity in the chain is detected responsive to determining that the test current is equal to an integer multiple of a forward bias current of one of the diodes of the plurality of diodes, and the integer multiple is equal to a number of the plurality of diodes.

9. The integrated circuit structure of claim 2, further comprising:
wherein the second pad is configured to provide an additional test current responsive to application of the forward bias voltage to each diode of the plurality of diodes and the first pad is set to the high impedance state.

10. The integrated circuit structure of claim 2, wherein for each diode:
an anode of the diode is coupled to the forward bias voltage; and
a cathode of the diode is coupled to the solder bump.

11. An integrated circuit structure comprising:
a first die;
a second die on a planar surface of the first die;
wherein the second die comprises a plurality of diodes; and
a plurality of solder bumps between the first die and the second die that electrically couple the first die to the second die;
wherein the plurality of solder bumps are coupled in series forming a chain;
wherein each diode is coupled to one of the plurality of solder bumps; and
wherein the first die comprises a first pad coupled to a first solder bump of the plurality of solder bumps at a first end of the chain and a second pad coupled to a last solder bump of the plurality of solder bumps at a second end of the chain.

12. The integrated circuit structure of claim 11, wherein the first pad is configured to provide a test current responsive to application of a forward bias voltage to each diode of the plurality of diodes and the second pad is set to a high impedance state.

13. The integrated circuit structure of claim 11, further comprising:
a first connection within the second die that couples the first solder bump and a second solder bump of the plurality of solder bumps; and
a second connection within the first die that couples the second solder bump and a third solder bump of the plurality of solder bumps.

14. The integrated circuit structure of claim 11, wherein the plurality of solder bumps are coupled using connections that alternate between a first type and a second type for consecutive ones of the plurality of solder bumps.

15. A method of testing an integrated circuit structure comprising:
applying a forward bias voltage to each of a plurality of diodes;
wherein each diode of the plurality of diodes is coupled to one solder bump of a plurality of solder bumps;
wherein the plurality of solder bumps are arranged in a serially connected chain;
measuring a test current from a first pad coupled to a first solder bump of the plurality of solder bumps in the chain while a second pad coupled to a last solder bump of the plurality of solder bumps in the chain is set to a high impedance state; and
determining whether a discontinuity is detected in the chain according to a comparison of the test current with a current threshold.

16. The method of claim 15, further comprising:
responsive to determining that the test current is equal to the current threshold, indicating that the discontinuity is not detected in the chain.

17. The method of claim 15, further comprises:
responsive to determining that the test current is less than the current threshold, indicating that the discontinuity is detected in the chain.

18. The method of claim 17, further comprising:
calculating a location of the discontinuity in the chain according to an amount of the test current.

19. The method of claim 15, wherein the current threshold is equal to a number of the plurality of diodes multiplied by a forward bias current for one of the plurality of diodes.

20. The method of claim 15, further comprising:
measuring an additional test current from the second pad while the first pad is set to the high impedance state; and
determining whether an additional discontinuity is detected in the chain according to a comparison of the additional test current with the current threshold.

* * * * *